(12) United States Patent
Eckenrode

(10) Patent No.: US 6,401,311 B1
(45) Date of Patent: Jun. 11, 2002

(54) RETAINING CLIP FOR COMPUTER EXPANSION CARD

(75) Inventor: Robert T. Eckenrode, North Canton, OH (US)

(73) Assignee: Tinnerman Palnut Engineered Products, LLC, Brunswick, OH (US)

( * ) Notice: Subject to any disclaimer, the term of this patent is extended or adjusted under 35 U.S.C. 154(b) by 0 days.

(21) Appl. No.: 09/589,412

(22) Filed: Jun. 7, 2000

(51) Int. Cl.[7] .......................... A44B 21/00; H05K 5/00
(52) U.S. Cl. .......................... 24/295; 24/293; 24/297; 24/458; 439/135
(58) Field of Search .................. 24/295, 293, 297, 24/296, 458; 411/508

(56) References Cited

U.S. PATENT DOCUMENTS

| | | | | |
|---|---|---|---|---|
| 4,601,247 A | * | 7/1986 | Welch et al. | 24/295 |
| 4,683,622 A | * | 8/1987 | Oehlke | 24/295 |
| 4,710,852 A | * | 12/1987 | Keen | 24/295 |
| 5,011,418 A | * | 4/1991 | Perzentka, Jr. | 439/135 |
| 5,101,540 A | * | 4/1992 | Roof et al. | 24/293 |
| 5,201,669 A | * | 4/1993 | Lin | 439/357 |
| 5,526,553 A | * | 6/1996 | Klein | 24/295 |
| 5,887,319 A | * | 3/1999 | Smith | 24/295 |

FOREIGN PATENT DOCUMENTS

| | | | | |
|---|---|---|---|---|
| AU | 0124540 | * | 1/1946 | 24/295 |
| AU | 0256166 | * | 10/1963 | 24/295 |
| FR | 1562236 | * | 4/1969 | 24/295 |
| GB | 0840556 | * | 7/1960 | 24/295 |

* cited by examiner

Primary Examiner—Victor Sakran
(74) Attorney, Agent, or Firm—Vytas R. Matas

(57) ABSTRACT

A spring clip having a flexible leg portion ending in a tab is made to be mountable in an expansion slot of a PC to allow the tab of the clip to capture either an expansion slot cover or a PC expansion card by having the tab spring into a hole found in both the expansion card and the blank cover fitting therein.

7 Claims, 3 Drawing Sheets

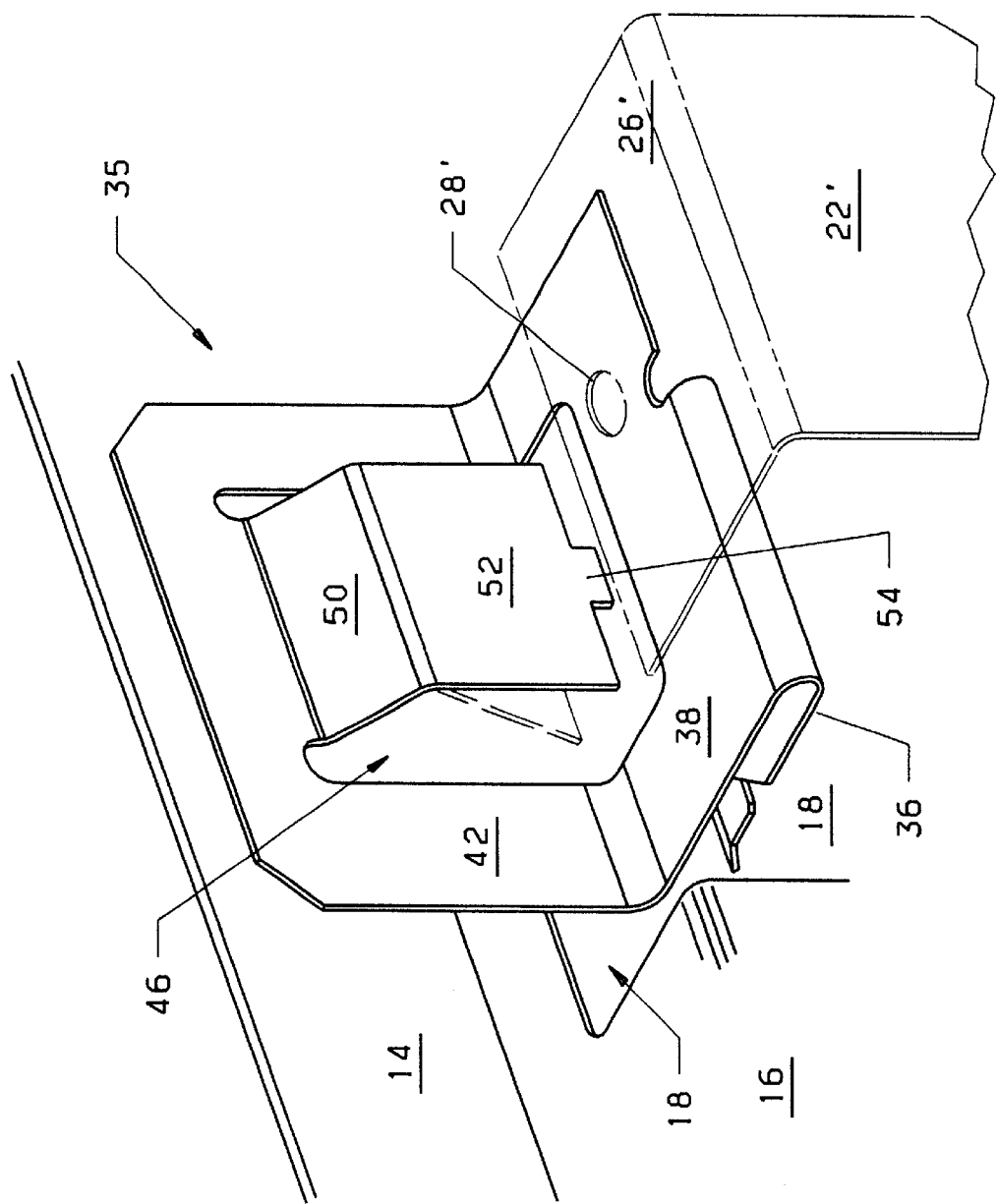

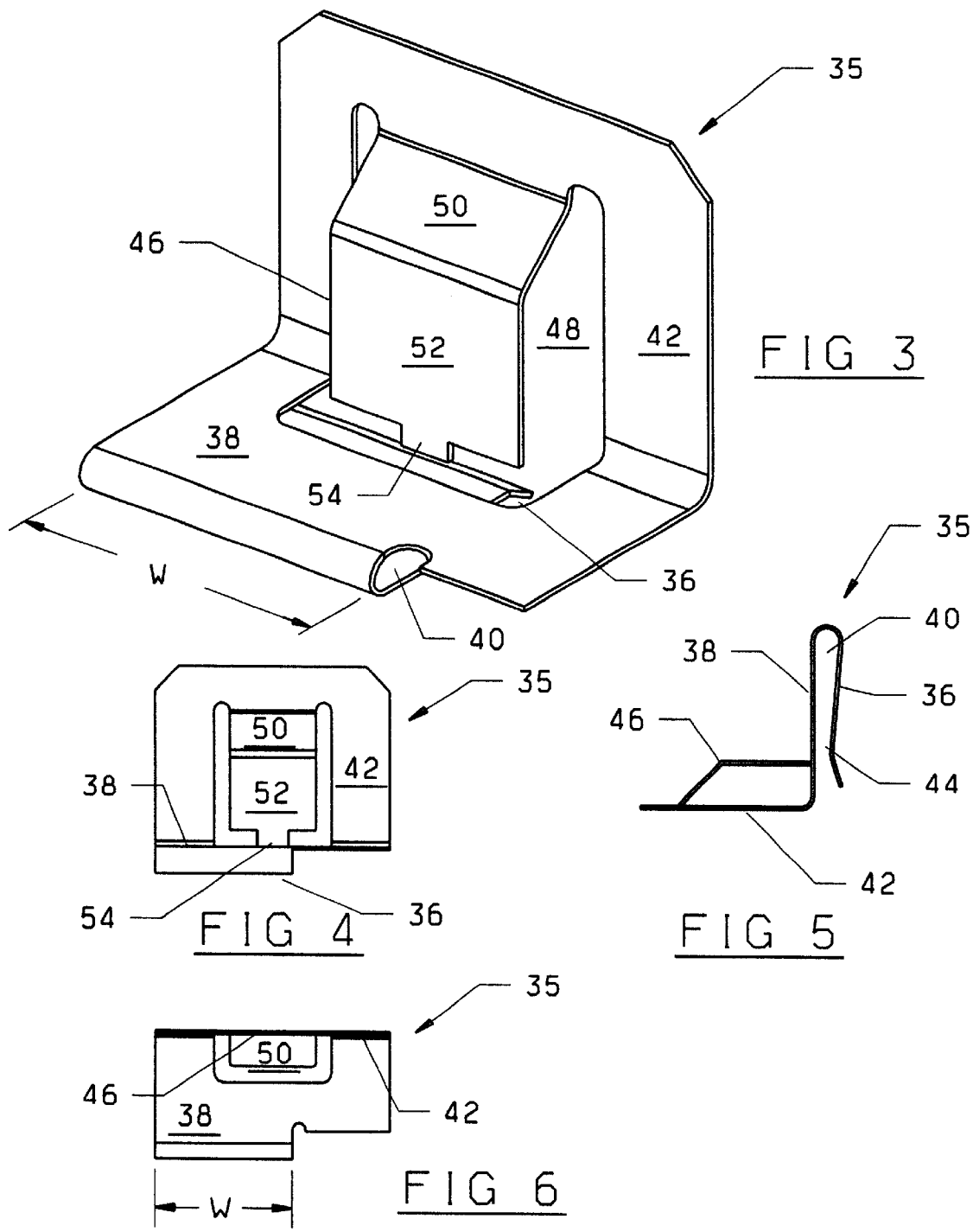

RETAINING CLIP FOR COMPUTER EXPANSION CARD

BACKGROUND OF THE INVENTION

1. Field of the Invention

The present invention relates to mounting PC (personal computer) expansion cards or covers into computer case slots provided for same and more particularly to clips for easing such mountings by obviating the need for screws to retain the expansion cards or covers on said slot.

2. Description of the Prior Art

Most PCs are bought with a limited number of functions. Extra functions such as modems, sound cards, math co-processor cards etc. may be added later by inserting an expansion card having the desired function into an expansion slot found at the back of the PC case. This expansion slot may be vertical or horizontal and is usually covered with a blank cover screwed to the PC case.

Referring to FIG. 1 it will be seen that the typical PC case (10) has a series of expansion slots (12) formed at the rear (14) of the PC case (10). These slots (12) extend from a ledge (16) and have a top opening (18) perpendicular to the slots (12). A series of circular holes (20) are centrally located at the end of each top opening (18). The opening (18, 12) are usually covered with blank covers (22) having a narrow tip (24) and a right angle leg (26) with a hole (28) therein. The tip (24) is inserted into a slot (30) with the cover (22) extending over opening (12) and the leg (26) extending over opening (18) and with the hole (28) being aligned with the ledge hole (20). A screw (32) is screwed into the ledge (18) through the hole (28) and may be extended to the hole (20) to positively lock the cover (22) over the expansion slot (12). This procedure is done for all the expansion holes in the initial manufacture of the PC.

When an expansion card (34) is needed, one cover (22) is removed from the conforming expansion slot and the expansion card (34) is located therein. Since the card (34) is typically mounted to a cover plate similar in construction to the plate (22) the prime numbering has been retained for similar parts of the expansion card and the blank cover. The insertion of the card (34) and cover (22') is as was described earlier for cover (22).

Since the holes (28, 20) are small, as is the screw (28), alignment and threading of the screw (28) into the aligned holes is time consuming and difficult with the screw usually falling into the PC case components and having to be fished out of there.

What the prior art lacked was a simple method of retaining expansion cards and blank covers in the PC case.

SUMMARY OF THE INVENTION

The present invention solves the problems associated with prior art cover retaining means and others by providing a clip mountable to the PC case for retaining either a blank cover (22) or an expansion card (34) for the PC over an expansion slot by snapping a flexible tip of the PC clip into the screw hole found in both blank covers and expansion cards.

In view thereof it will be seen that one aspect of the present inventions is to provide a means for mounting a PC expansion card or expansion slot cover over an expansion slot in the PC without the use of screws.

Another aspect is to provide a clip which is easily mounted to a PC case to retain either PC expansion cards or blank expansions slot covers during the initial manufacture of the PC.

These and other aspects of the present invention will be more fully understood after a review of the following description of the preferred embodiment when considered with the accompanying drawings.

BRIEF DESCRIPTION OF THE DRAWINGS

In the drawings:

FIG. 2 is an expanded perspective view of the PC clip of the present invention mounted to a PC case for retaining either a PC expansion card or expansion slot cover;

FIG. 3 is a perspective view of the PC clip of the present invention;

FIG. 4 is a front view of the PC clip of FIG. 3;

FIG. 5 is a side view of the PC clip of FIG. 3; and

FIG. 6 is a top view of the PC clip of FIG. 3.

DESCRIPTION OF THE PREFERRED EMBODIMENT

Figure 1:
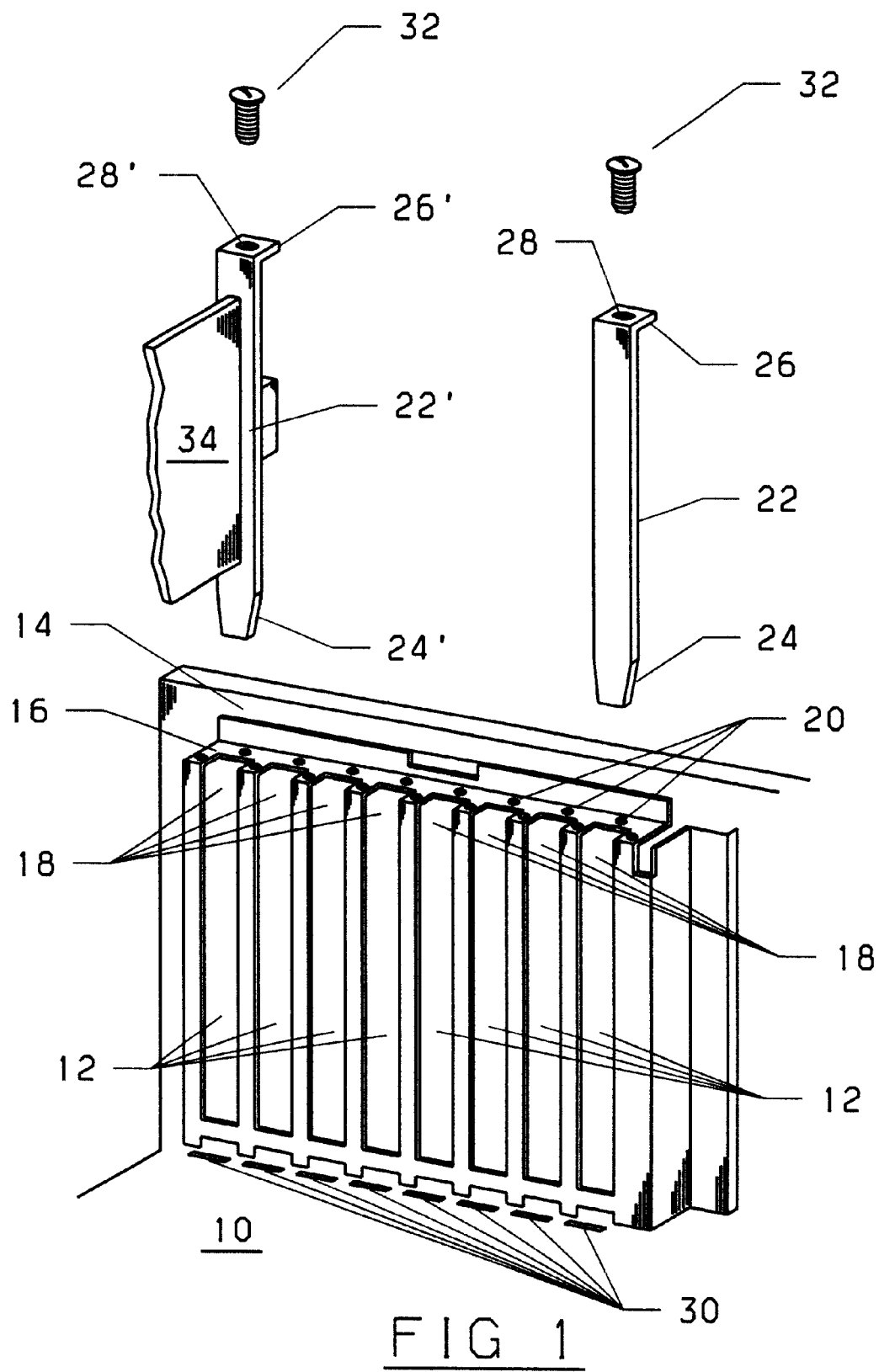
FIG. 1 is a perspective view of prior art PC expansion card and expansion slot cover mountings.

Referring now to FIGS. 2–6, it will be understood that while the reference is to a single slot cover or PC clip (35) it will be understood that a plurality of same could be mounted to a plurality of expansion slots in a similar manner.

The clip (35) has a curved portion (36) folded back over a top ledge portion (38) to form a pocket (40) there between for retaining the ledge (16) portion of the PC case (14) directly behind one of the openings (18). A backplate (42) extends at a right angle up from the ledge portion (38) and is made to rest up against the PC case (14) with the ledge (16) open portion extended inside the pocket (40). The curved portion (36) has an angled tip (44) formed therein angled to bend down when the ledge (16) is inserted into the pocket (40) to be easily fitted into the pocket (40). However, the tip (44) will be bent up with any attempt to remove the ledge (16) from the pocket (40) causing interference for any attempted removal of the ledge (16).

The width W of the pocket (40) is made to be the same or slightly smaller than the width of the openings (18) to allow the capture of the ledge (16) portion behind the opening (18).

A flexible wing portion (46) is formed from the back plate portion (42) and the ledge portion (38) leaving a right angle opening (48) therein. The wing portion (46) is formed as an angled portion (50) having a straight leg portion (52) extending down therefrom and having a tab (54) at the end of the straight leg (52). The angled portion (50) extends away from the backplate portion (42) sufficiently to have the tab (54) align with one of the holes (20) when the clip (35) is properly fitted to the case (14).

Now, with the PC clip (35) properly installed, either during initial manufacture of the PC or as a retrofit, when either a blank cover plate (22) or a PC expansion card (22') is installed into one of the openings (12) having a clip (34) mounted therein, the leg portion (26, 26') is aligned to have the tab (54) in line with the opening (28,28'). It is then pushed against the straight leg portion (52) moving it back until the restoring force of the spring in the flexible member (46) overcomes the pushing force and the tab (54) is pushed into the opening (28,28') which is aligned with one of the holes (20). To disengage, the leg portion (52) may be raised out of the hole (28) releasing the cover plate or expansion card (22,22'). Alternately, the card or plate may be forced back until the tab is disengaged from the hole.

Certain modifications and additions will occur to those skilled in the art area upon reading this disclosure. It will be understood that all such were deleted herein for the sake of conciseness and readability but are intended to fall within the scope of the following claims.

As an example, the clip (35) can be fitted to expansion slots having no hole s (20) in the case area around the slot (18) and will still capture expansion cards and slot covers which are formed with a hole for mounting to the expansion slot with a screw.

What is claimed is:

1. A spring clip for retaining a PC expansion card member mountable in an expansion slot of a PC backplate comprising:
   a pocket portion for retaining a ledge of the PC case over an expansion slot of the PC backplate;
   a body portion extending up from said pocket portion to fit against a case of the PC;
   a flexible spring leg portion extending from said body portion to be alignable with a hole formed in the ledge of the PC backplate over the expansion slot; and
   a tab extending from said flexible spring portion to be able to fit in an aperture of the PC expansion member when it is mounted in the expansion slot.

2. A spring clip for retaining a member as set forth in claim 1 wherein said pocket portion is formed by a curved member bent over a ledge portion extending at a substantially right angle to said body portion to form a pocket between said ledge portion and said curved member.

3. A spring clip for retaining a member as set forth in claim 2 including a tab extending from said curved member into said pocket for providing easy entry but difficult exit to a section of the PC case when said clip is being mounted to the PC case.

4. A spring clip for retaining a member as set forth in claim 3 wherein said pocket has a width substantially equal to the width of a PC expansion slot.

5. A spring clip for retaining a member as set forth in claim 4 wherein said flexible leg portion is formed by an angled portion extending from said body portion and a straight portion extending down from said angled portion with said tab being formed at the end of said straight portion.

6. A spring clip for retaining a member as set forth in claim 5 wherein said angled portion extends said straight portion away from said body portion a distance sufficient to align said tab with a hole on the ledge of the PC case at the expansion slot when said clip is mounted to the PC case.

7. A method of mounting a member having a hole therein for mounting the member in an expansion slot of a PC having a hole in a ledge of the PC case forming the slot comprising the steps of:
   providing a spring clip having a flexible arm portion ending in a tab;
   mounting the spring clip in the expansion slot of the PC to have the tab of the spring clip align with the hole of the ledge of the PC;
   aligning the member with the tab of the spring clip to have the hole of the member align with the tab;
   pushing the member against the spring clip until the tab is captured in the hole of the member; and
   the member being a PC expansion card being pushed against the spring clip after the step of removing a blank cover from the expansion slot prior to the step of providing a spring clip.

* * * * *